United States Patent
Farkas

(10) Patent No.: US 7,496,466 B2
(45) Date of Patent: Feb. 24, 2009

(54) SYSTEM FOR FAULT DETERMINATIONS FOR HIGH FREQUENCY ELECTRONIC CIRCUITS

(75) Inventor: Alexander T. Farkas, Norfolk, MA (US)

(73) Assignee: Huntron, Inc., Mill Creek, WA (US)

( * ) Notice: Subject to any disclaimer, the term of this patent is extended or adjusted under 35 U.S.C. 154(b) by 0 days.

(21) Appl. No.: 11/625,175

(22) Filed: Jan. 19, 2007

(65) Prior Publication Data

US 2008/0177486 A1     Jul. 24, 2008

(51) Int. Cl.
*G01R 31/302* (2006.01)

(52) U.S. Cl. .................. 702/117; 702/58; 702/185; 324/529; 324/530; 324/750; 324/537

(58) Field of Classification Search ............... 702/57, 702/58, 59, 75, 76, 77, 117, 124, 125, 185; 324/529, 530, 537, 750, 632, 513, 754
See application file for complete search history.

(56) References Cited

U.S. PATENT DOCUMENTS

| | | | | |
|---|---|---|---|---|
| 4,829,238 A | * | 5/1989 | Goulette et al. | 324/95 |
| 4,965,516 A | * | 10/1990 | Parshotam et al. | 324/606 |
| 5,006,788 A | * | 4/1991 | Goulette et al. | 324/95 |
| 5,218,294 A | * | 6/1993 | Soiferman | 324/158.1 |
| 5,424,633 A | * | 6/1995 | Soiferman | 324/158.1 |
| 5,521,513 A | * | 5/1996 | Stringer | 324/537 |
| 6,201,398 B1 | * | 3/2001 | Takada | 324/537 |
| 6,300,779 B1 | * | 10/2001 | Tamaki et al. | 324/750 |
| 6,759,850 B2 | * | 7/2004 | Harzanu et al. | 324/522 |
| 6,937,035 B2 | * | 8/2005 | Kawaike et al. | 324/750 |
| 7,009,399 B2 | * | 3/2006 | Olsson et al. | 324/326 |

* cited by examiner

*Primary Examiner*—Eliseo Ramos Feliciano
*Assistant Examiner*—Mi'schita' Henson
(74) *Attorney, Agent, or Firm*—Clark A. Puntigam; Jensen & Puntigam, P.S.

(57) ABSTRACT

A positioning system is provided for mounting a circuit board or device to be tested, and for mounting a sensor assembly, the positioning system having the capability of moving the sensor assembly in three dimensions. The sensor assembly is positioned on the mounting assembly such that it is not in contact with the circuit board under test. The sensor assembly in operation samples the electromagnetic field emanating from the circuit under test and converts those signals into a representative electrical signal in a digitized format. A processing system compares the measured values from the sensor assembly with reference values from the same point in a circuit known to be good and provides an indication to the user as to whether the difference therebetween is within an acceptable range or outside thereof.

10 Claims, 6 Drawing Sheets

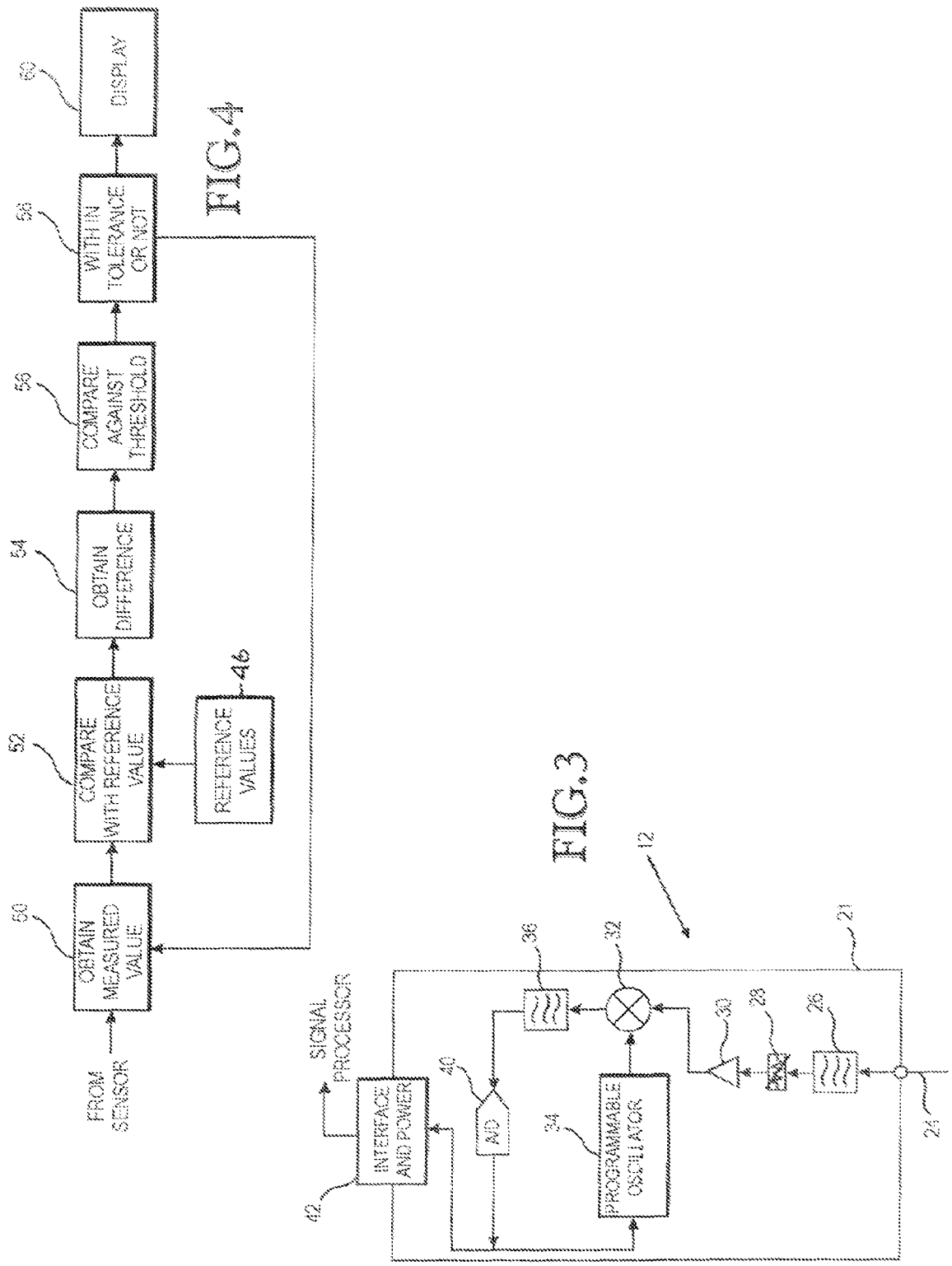

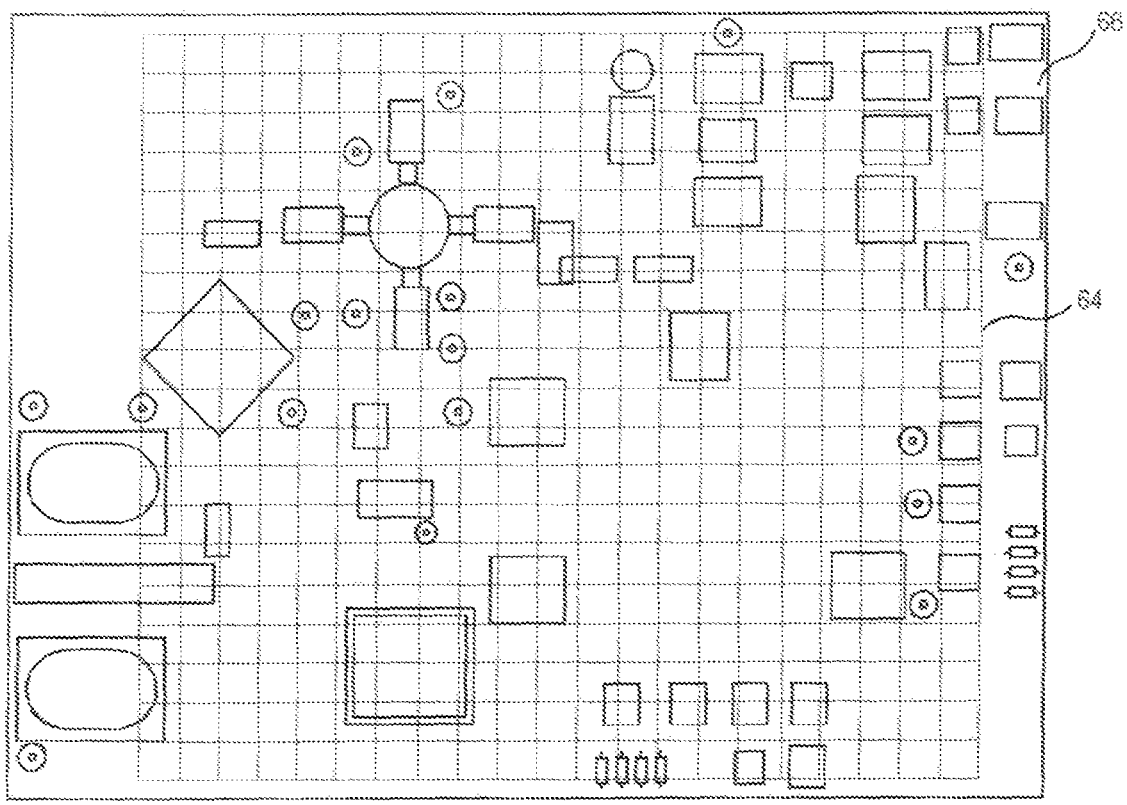
FIG.5
FIG.6
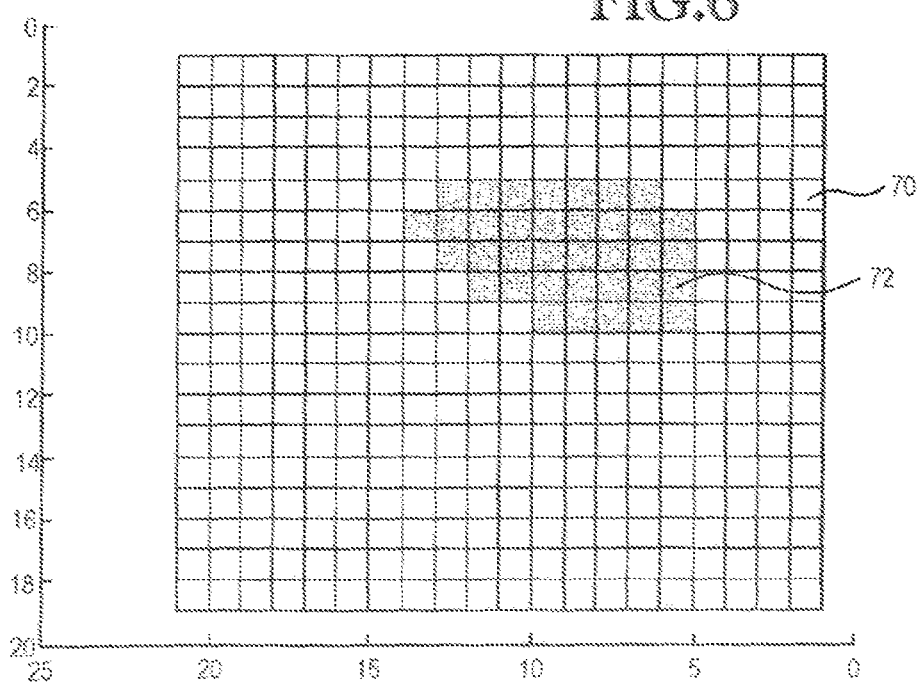

SYSTEM FOR FAULT DETERMINATIONS FOR HIGH FREQUENCY ELECTRONIC CIRCUITS

TECHNICAL FIELD

This invention relates generally to determination of faults in electronic circuits, and more specifically concerns a system for making fault determinations for high frequency electronic circuits.

BACKGROUND OF THE INVENTION

It is well recognised that fast and accurate fault determinations for electronic circuits involving component failures or degradation is important. Electronic components and/or circuits or other elements present on circuit boards may fail in the field due to damage, age or otherwise degrade sufficiently that they no longer meet the manufacturer's specifications. The failed circuit boards are tested to determine the source of the failure, which typically will be one or more components, electrical connections or other elements on the board.

Following the fault diagnosis, attempts are typically made to repair the board. Standard test/diagnostic practices for troubleshooting a circuit board include the use of various testing devices which are designed to identify one source of the failed or marginal component, other circuit element or connection. These test devices include the use of benchtop equipment involving either automatic or manual comparison of digital signatures of circuit components while the circuit is operating. Such a device is shown and described in U.S. Pat. No. 4,965,516. Such devices include probes which physically contact circuit elements, produce a signal signature, usually in response to a signal stimulus, and then compare that signature with a standard or reference signature. The signature can be in analog or digital format.

These test/diagnostic devices are best suited for circuits operating below 100 MHz. At significantly higher circuit frequencies, i.e. 200 MHz and above, including most RF (radio frequency) circuits and microwave circuits, such devices are usually not effective. Any contacting circuit element, such as a probe, used to obtain signals from such an operating circuit is likely to produce self-generated failures in the circuit or a distortion in the signature. Thus, conventional fault determination test devices and techniques are typically not useful with high frequency circuits.

Hence, it is desirable that test equipment and techniques be developed which are capable of making reliable and accurate fault determinations in high frequency circuits, without introducing errors into the determination.

SUMMARY OF THE INVENTION

Accordingly, the present embodiment is a system for making fault determinations in high frequency circuits, comprising: a positioning system for fixedly mounting a circuit board or device to be tested and for mounting a sensor assembly, said positioning system capable of moving the sensor in X, Y and Z dimensions relative to the circuit board; a control system for the positioning system for registering the position of the sensor assembly relative to the circuit board to be tested and for moving the sensor assembly to selected known locations for the circuit board to be tested; a sensor assembly, mounted on the positioning system, above the circuit board to be tested, such that it does not come into physical contact with the circuit board during testing of the circuit board, for obtaining electromagnetic signals emanating from the circuit board at selected known locations and for converting said electromagnetic signals into a measured signal value representative of the electromagnetic signals in a digitized format; and a processing system for comparing measured signal values from the sensor at selected known locations for the circuit board under test and reference signal values from the same locations in a similar circuit board known to be good and for providing an information display concerning whether or not the difference between the measured signal values and the reference signal values is within a selected acceptable range, or outside thereof, which is indicative of a fault at said selected location.

BRIEF DESCRIPTION OF THE DRAWINGS

FIG. 3 is a block diagram of a sensor portion of the system of FIG. 1.

FIG. 4 is a flow chart of the processing steps carried out by one system in FIG. 1.

FIG. 5 is a grid overlay on a representative electronic circuit for display of results produced by the system of FIG. 1.

FIG. 6 is a pixel display produced by the system of FIG. 1 for a circuit board having a high frequency fault.

BEST MODE FOR CARRYING OUT THE INVENTION

Figure 1:
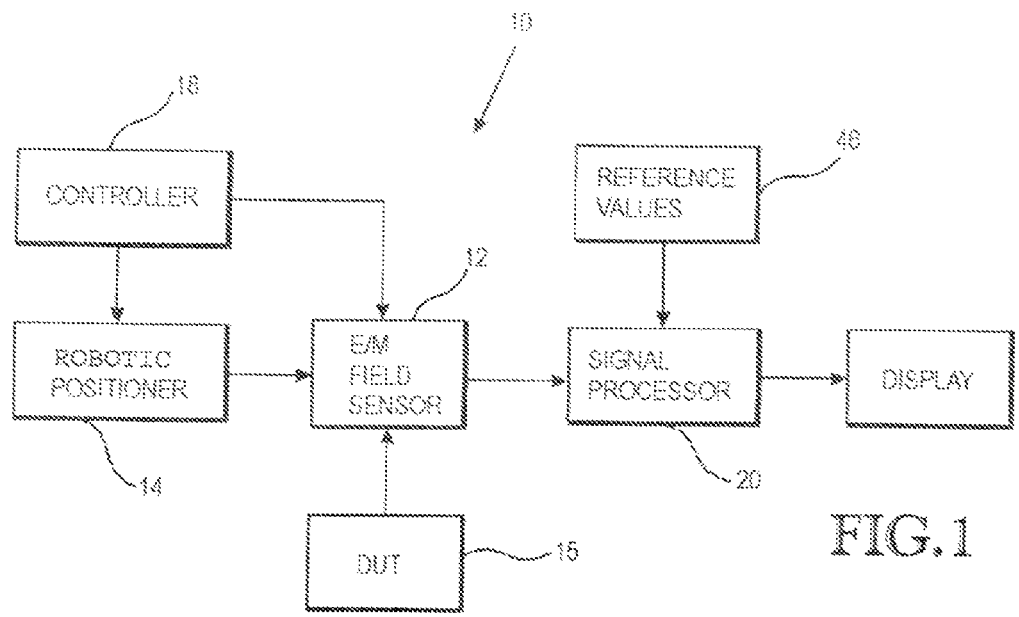
FIG. 1 is a block diagram of the overall system disclosed herein.

The circuit fault diagnostic system disclosed herein is designed to determine the location of faults in electronic assemblies, circuits and systems, particularly those involving high frequency, i.e. 200 MHz or greater, including RF (radio frequency) and microwave frequency ranges. The fault diagnostic system relies on the fact that electronic circuits with time varying or changing current flows create both electric and magnetic fields, producing an electromagnetic field in the space surrounding the location of the current flows.

The magnitude and spatial distribution of these electromagnetic fields vary significantly, as a function of circuit geometry, the physical and chemical characteristics of the immediate volume around the circuit, including both metallic and nonmetallic elements, the magnitude of the currents themselves and the magnitudes and phases of other current flows in the vicinity. The electromagnetic fields are also directly influenced by the frequencies of the alternating currents in the circuit. Transient and complex time varying waveforms contain a multitude of frequencies, each independently contributing to the characteristics of the electromagnetic field.

Modern circuit assemblies are mass produced using sophisticated manufacturing technology. All geometric and electrical characteristics of such circuit assemblies are maintained within narrow tolerances to insure consistent performance. Final testing is typically made prior to shipment to insure proper operation, using well known automated test equipment. The electromagnetic field generated at any selected location in the same circuits would therefore be the same or very close to the same, given identical environmental and operating conditions. The electromagnetic field produced by high frequency circuits at specific physical locations in the circuit, after detection and processing, is hereinafter referred to as an electromagnetic field signature or signature signal for that location.

The present system, in general, obtains an electromagnet field signal produced by the circuit/device under test, referred to generally as a DUT, without any physical contact (such as would occur with a probe), at a plurality of specified locations on the circuit board. This testing can be done with a general or "global" approach, in which the entire board is tested, with a large number of successive electromagnetic field signals at specific, successive positions covering the entire board, or with a more localised approach, obtaining electromagnetic field signals only at specific selected positions on the board.

The obtained signals (the electromagnetic field information) are then processed to produce a digitized signature signal for that location, which is then compared in a signal processing system with a "reference" digitised signature signal, previously stored, from the same location in a circuit known to be good. The difference between the measured signature signal and the reference signature is then compared against a threshold level, and the results displayed in a selected manner to inform the user as to whether the measured signal is within an acceptable pre-established level of performance. The displays can take various forms, including graphical displays, tabular, computer readable or other format.

Referring now specifically to FIG. 1 which shows the system in block form generally at 10, including an electromagnetic (EM) field sensor 12, which is explained in more detail below. The EM field sensor 12 is mounted in a robotic positioning device 14 which is capable of accurately moving the sensor from location to location relative to the circuit or device under test. A circuit board 15 to be tested is also mounted in the robotic positioner.

Figure 2:
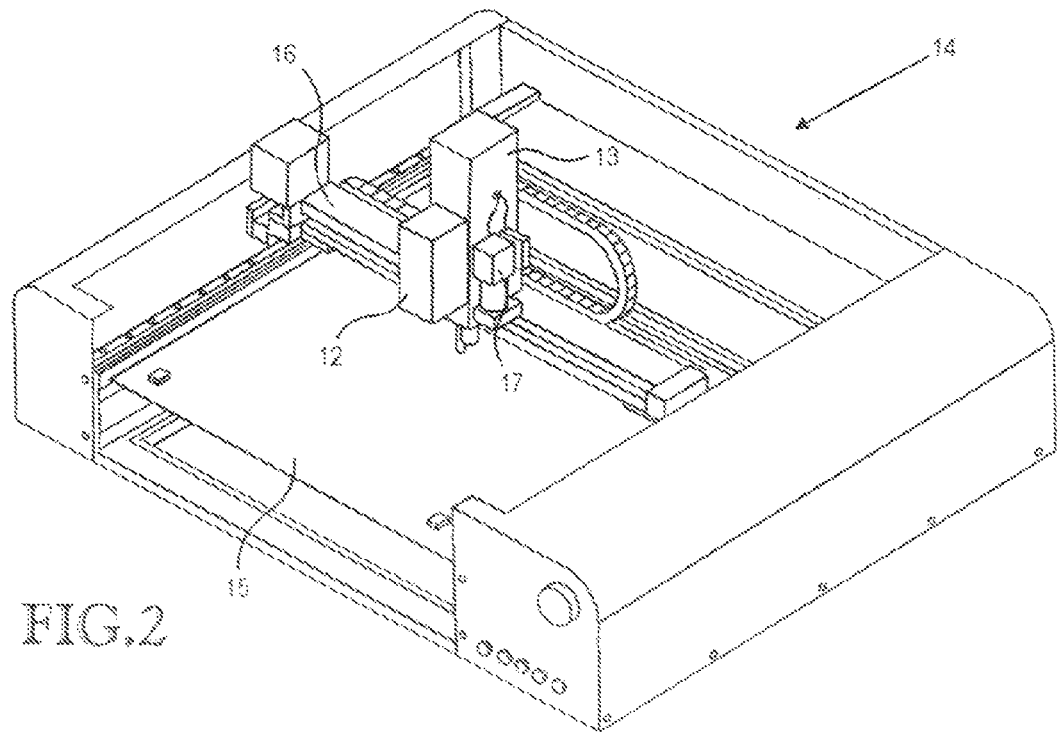
FIG. 2 is a perspective view of a portion of the system of FIG. 1.

FIG. 2 shows such a robotic positioner 14, which is disclosed in more detail in U.S. Pat. No. 7,091,730, which is hereby incorporated by reference. Positioner 14 has a mounting assembly 13 to which sensor 12 is secured, as well as a camera 17, and is capable of moving the mounting assembly, with sensor 12, in X, Y and Z axis dimensions. In particular, the positioner 14 is capable of locating the sensor at selected XY points on the printed circuit card and then moving the sensor in the Z direction to provide a desired distance between the circuit being tested and the sensor. This capability of adjustable physical separation between the sensor and the circuit being tested is particularly important for the high frequency circuit testing system disclosed herein.

The mounting assembly 13, with sensor 12, is positioned on a carriage 16 which is capable of moving in the X direction relative to the circuit board. Mounting assembly 13 is moveable along carriage 16 in the Y direction, so that in combination, all XY positions within the field of coverage of the positioner are accessible. The mounting assembly 13 for the sensor is also movable in the Z direction, toward and away from the circuit board 15. The positioning device 14 is moved in the X, Y and Z dimensions automatically by software control in a controller 18 to selected points on the circuit to be tested. The controller 18 also is capable of registering, i.e. orienting, the sensor 12 relative to the circuit board at the start of the process to ensure accurate signature comparison between the measured signals and the reference signals, i.e. the determined signature and the reference signature. For instance, XY datum point 0,0 for the sensor can be registered to correspond to the left lower corner of the device under test. This is a reference (home) position for the sensor 12 relative to the circuit board, being tested, providing a basis for the controller for locating all subsequent positions on the board and for obtaining the corresponding reference values.

The positioner 14 moves the mounting assembly and the sensor by stepper motors or other devices relative to X, Y and Z coordinates for selected locations around the board. The positioner is not described in further detail, since such devices are known and available commercially, such as one from Huntron Instruments Inc., and further are described generally in the '730 patent.

The electromagnetic field sensor 12 which obtains a signal from the field which is generated by the circuit under test is shown in FIG. 3. Sensor 12 is enclosed in a Faraday enclosure (shield) 21 and includes a transducer element 24 which extends outside the enclosure 21. Transducer 24 can take various forms, including different kinds of antennas, such as a monopole or dipole antenna, a loop antenna or a planar patch antenna. Other arrangements could include a pickup or a solenoid coil. Typically an antenna will be very short, on the order of ½ cm. The transducer is positioned in the electromagnetic field produced by the circuit under test.

Signals excited in the transducer 24 are applied to an input filter 26. The signal from the transducer represents field power levels spanning a wide range, i.e. typically milliwatts to nanowatts. Input filter 26 filters out noise from environmental machinery and other devices, including cell phones, in the vicinity of the circuit being tested. The output from filter 26 is applied to a variable attenuator 28 which reduces the level of voltage, i.e. power of the signal, if necessary. There may be certain locations in the circuit being tested involving higher power devices. In those situations, the input signal at transducer 24 will be larger than desired for processing. In some cases, one power is on the order of a milliwatt, which is, in the embodiment shown, reduced by attenuator 28. However, it should be understood that the voltage signal need not be attenuated, depending upon the follow-on processing circuitry.

The output of the variable attenuator 28 is then applied to a low noise amplifier 30 which amplifies the signal if necessary. The received signal at transducer 24 is could be extremely low-level, i.e. into the nanowatt area. In such a case, the signal is amplified by amplifier 30. Typically, the power levels will be on the order of microwatts or in some cases nanowatts for processing.

The output of amplifier 30 is applied to one input to a conventional miner 32. The output of a programmable oscillator 34 is supplied to the other input of mixer 32. The results from the mixer are sum and difference frequencies between the programmable oscillator input frequency and the input frequency from amplifier 30. The sum frequency signals, which could be in the gigahertz range, are not used. Filter 36 filters the sum frequency and produces the difference frequency, which in the embodiment shown is on the order of approximately 10 MHz or less, although again, this can be varied. In the embodiment shown, programmable oscillator source 34 is a frequency synthesiser capable of producing a range of signals, for example, within the range of 200 MHz to 26 GHz. The actual frequency will vary depending upon the particular application; it can also be outside the above range if necessary for a particular application.

The difference frequency output of filter 36 is applied to an A-D converter 40, which converts the input analog signals into a digital signal (digital bits) which can then be processed in a digital signal processor. This digitised signal from A/D converter 40 is applied to an interface circuit 42. The signal from circuit 42 is then applied to the signal processing system 20. The signal processor 20 will take the output of the sensor 12, referred to as a measured signal, which is typically a voltage signal from a single particular location to space above or near the surface of a circuit board under test and will compare it against a reference value 46 which is available to signal processor 20 from an identical location on a same board which is known to be good, i.e. a board operating within the manufacturer's standards at the time one reference values were obtained. This analysis and comparison process is repeated as many times as necessary, an successive locations, in order to made an accurate fault determination for the circuit.

The reference values (e.g. value 46) are previously obtained and then stored for use in testing/diagnosis by the system described herein. The reference values are obtained typically from tests made during manufacture of the circuit board which is to be tested. Typically a large number of such tests on a large number of manufactured circuit boards are used to determine a range of values which meets the manufacturer's specifications for each test location on the board. The multiple values are to determine an average value.

Referring to FIG. 4, after a measured value at a selected location is obtained, at block 50, that value is then compared by the processor against the reference value 46 for that same location, at block 52. A difference value is then obtained, at block 54. The difference value is them compared against a pre-established threshold value, at 56, and a determination is made, at block 58, whether the measured value is within tolerance or not. A display is then produced, at block 60, indicating the result of the test at the one location, i.e. whether or not the measured value is within tolerance at that location. The display can take various forms, including a graphical display, such as an overlay, a tabular display or various other readouts of the results. The various display possibilities are discussed in more detail below.

In detailed operation, a circuit board 15 or other device to be tested is first positioned in robotic positioner 14. The sensor 12 mounted on the positioner is then moved through a plurality of positions, determined by controller 18. The sequence of positions will cover a selected area on the circuit being tested. For instance, one test, area on a board could cover 2 cm×2 cm, in one millimeter successive increments, producing a grid of measured values. This is one example only and can certainly vary depending upon a particular application. The test area could be larger or smaller, and the individual locations could be closer together or farther apart. FIG. 5 shows an overlay of a grid 64 (1 millimeter increments) over a selected circuit portion 66 of 2 cm×2 cm. This has the possibility of a total of 400 separate measurements to cover the circuit area if each possible grid location is used. Again, a larger area can be covered, up to the full XY range of movement of the mounting assembly in the positioner, with a selected distance between successive measurements.

In one embodiment (1 mm center-to-center grid positions), the electromagnetic field from each possible position in the grid is measured, while in another embodiment, only selected locations are measured, depending upon the individual circuit to be tested and/or the likelihood of failure of particular components. The selection will depend upon the particular application. Processing each possible location on the board will extend the total test time.

The measured electromagnetic field values at each location are then compared against reference values from a board known to be good or an averaged series of boards known to be good, as indicated above. Thus, accurate initial registration of the sensor to the board under test and accurate subsequent movements of the sensor are important if reliable test results are to be obtained, since it is important that each comparison is made between a measured value and the corresponding reference value at the same selected points to the circuit.

As indicated, above the results can be shown in various forms, including graphical, tabular or computer readable formats, including supplying a pass/fail indication for each location.

Figure 7:
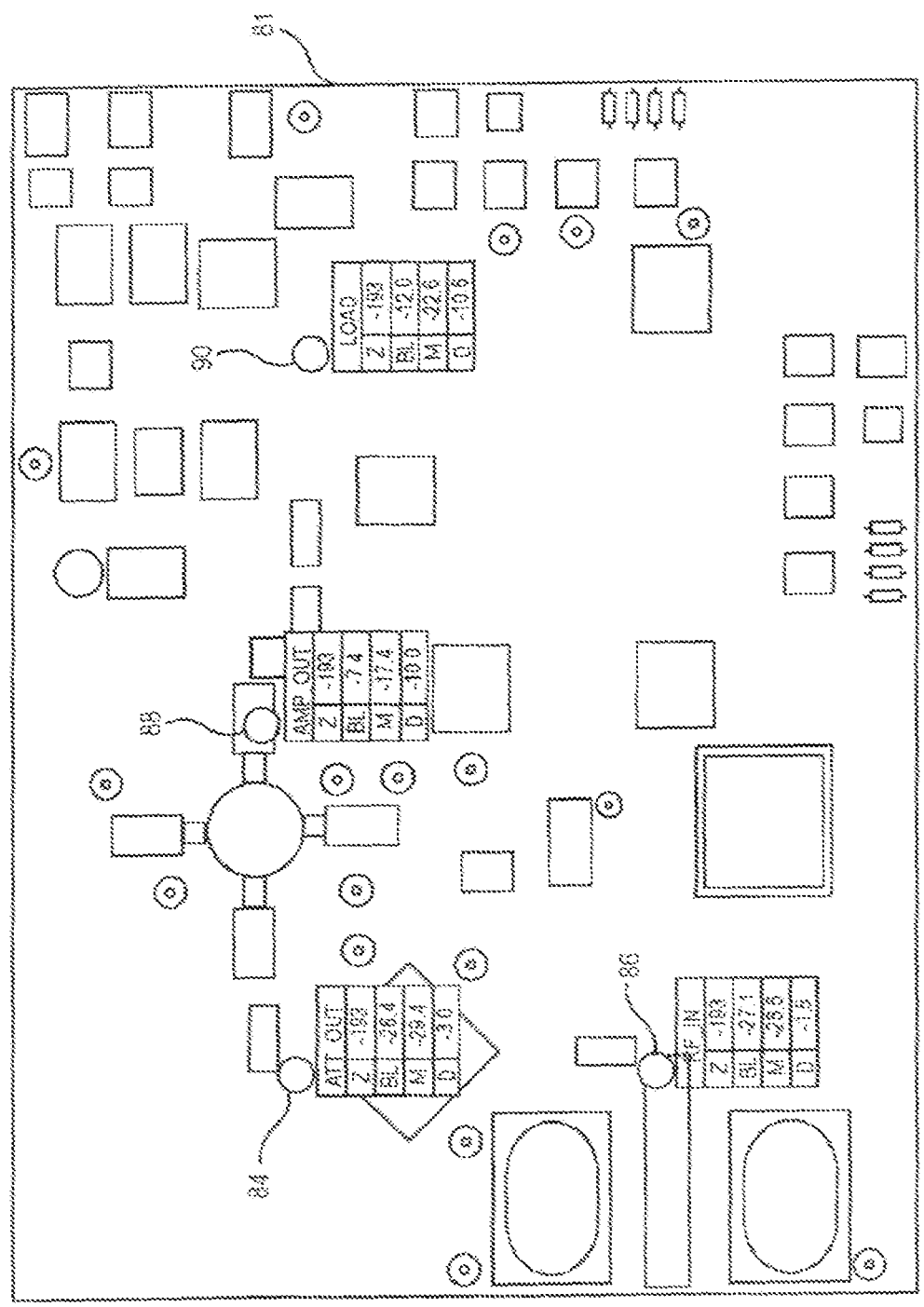
FIG. 7 is a display showing fault analysis points on a circuit portion.

One graphical display is shown in FIG. 7, which represents in drawing form an actual picture of an area 81 of the circuit under test, which can be provided by camera 17 mounted on the mounting assembly. The picture (display) of the actual circuit has overlaid on it particular locations where measurements were taken. FIG. 7 is intended simply to represent a part or a circuit. The display provided by the system will be a camera picture of the actual circuit. In the example or FIG. 7, four measurements were taken, at locations 84, 86, 88 and 90. Information at locations 84 and 86 indicate that, the measurements made at those points were within a selected tolerance (above a threshold) relative to a circuit/element known to be good, while at locations 88 and 90, the circuit showed abnormal performance, indicating a fault at those locations.

The fault indications, for the convenience of the technician/user, are identified by a red dot, while the fault determinations within are identified by a green dot. Other colors indicators, however, may be used to indicate a fault determination or satisfactory performance.

In addition, specific information can be provided at each point, relative to the data obtained. In this case the Z field is the distance (in microns) of the position of the sensor above the level of the board. The field "BL" refers to the baseline (reference) value (in terms of dBm power), while the "M" field refers to the actual measured value at that point (in terms of dBm power). The "D" term refers to the difference between the two. The technician, from FIG. 7, is thus directed to two specific areas on the board for further investigation.

A tabular format could include a bar graph or similar display, which indicates, for each measurement location, whether or not the difference between the measured and reference values is within a pre-specified tolerance. In another format, the display indicates simply whether or not a fault determination has been made (yes/no or fault/no fault) relative to the selected locations.

Figure 8:
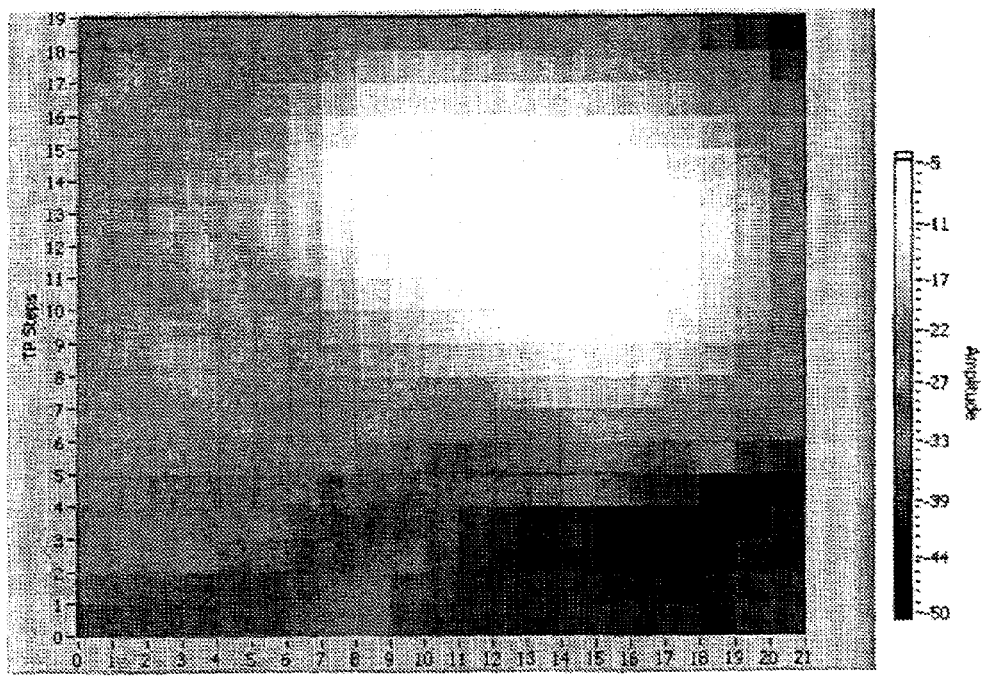
FIGS. 8 and 8A are pixel displays of a fault determination for a circuit under two different bias (stimulus) conditions.
Figure 8A:
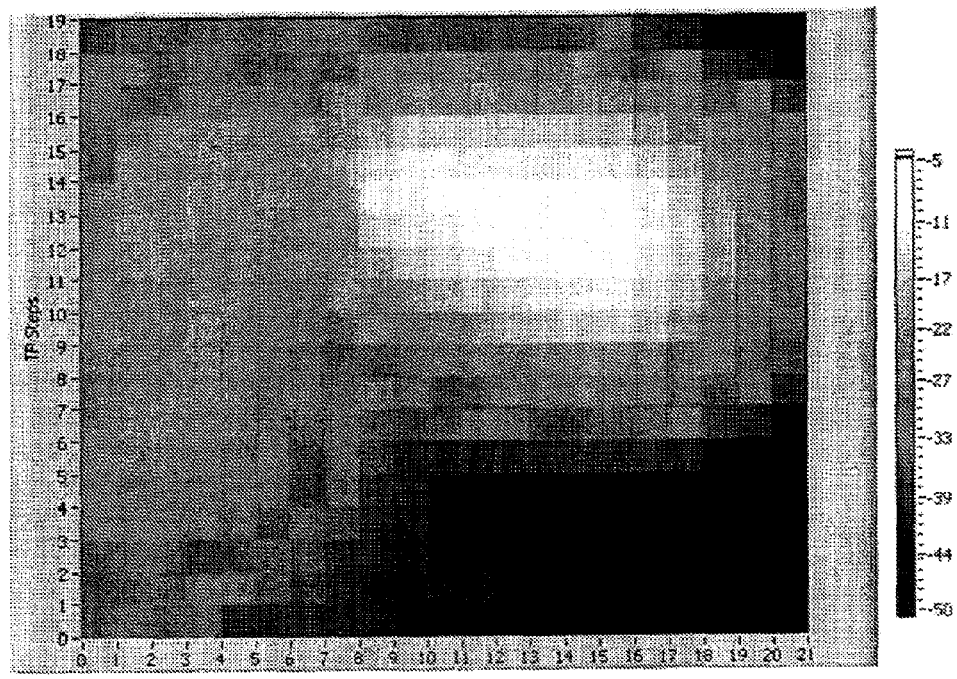
Figure 9:
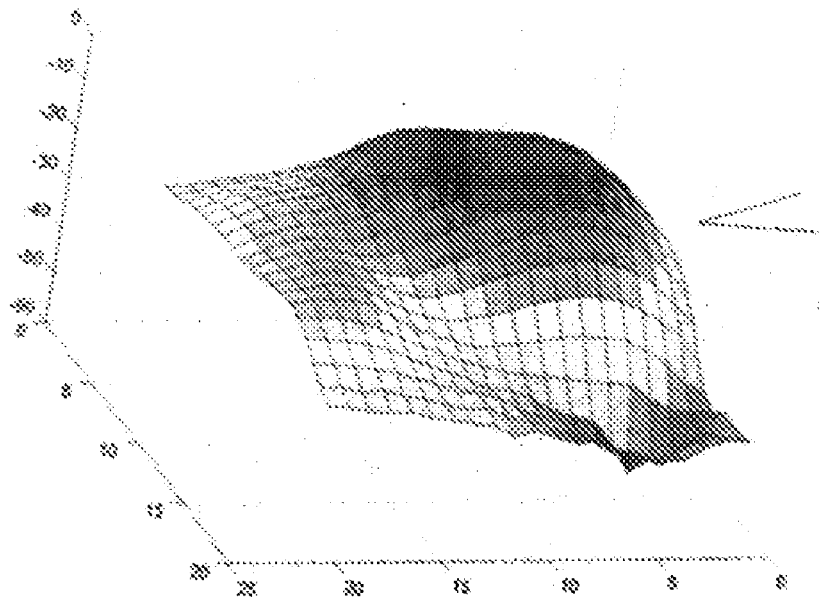
FIGS. 9 and 9A are 3-dimensional representations of the display of FIGS. 8 and 8A.
Figure 9A:
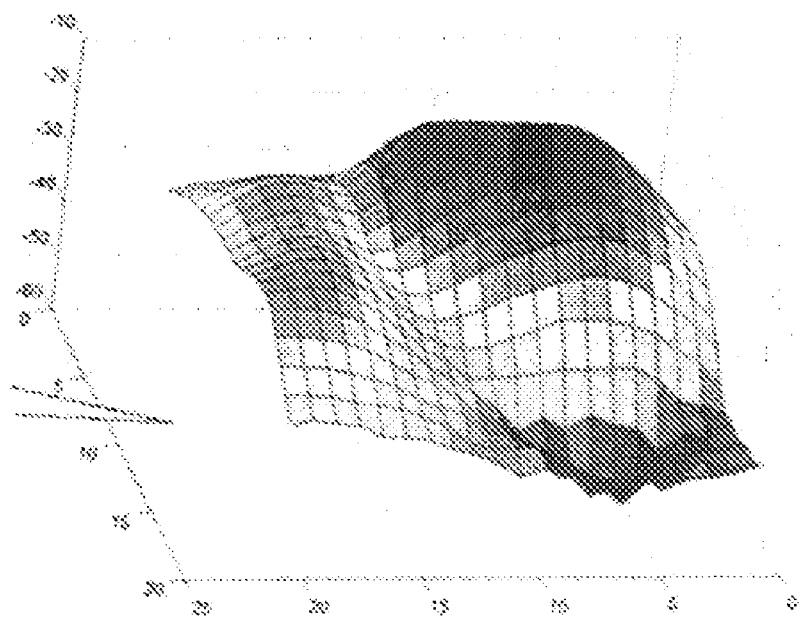

The test procedure can be carried out with the circuit under test operating with normal power input, in which the circuit board or other device being tested is in a typical operating mode, or a specific electric signal stimulus may be applied to the circuit during performance of the test. Measured signals can also be used to detect degradation in performance which has not yet resulted in a failure. The differences in a bias voltage applied to the current induce changes in high frequency behavior/operation of she circuit. FIGS. 8 and 8A are pixel diagrams which show the response of a circuit area when a 10 V bias is applied to an amplifier (FIG. 8) and when an 8V bias is applied (FIG. 8B). FIGS. 8 and 8A are different, indicating that a change (degradation) can be detected using the electromagnetic field approach described, herein. FIGS. 9 and 9A show a 3-D version of FIGS. 8 and 8A, making the differences between the two displays even clearer. FIG. 6 is a fault probability plot from the data obtained and processed relative to the application of different bias voltages to the circuit, with areas 72 and 70 providing fault probability information. The fault probability plot can then be overlaid on a picture of the actual circuit to determine the location of the problem components.

Accordingly, a system has been disclosed which is capable of making fault, determinations for high frequency circuits. The system measures the electromagnetic field produced by a circuit under test, without physical contact with the circuit.

The electromagnetic field signal is processed and then compared with reference values from the same location in a circuit known to be good. If the difference is outside of a specified tolerance range, a fault is indicated. Repair of the circuit is thus facilitated.

Although a preferred embodiment of the invention has been disclosed here for the purposes of illustration, it should be understood that various changes, modifications and substitutions may be incorporated in the embodiment without departing from the spirit of the invention, which is defined by the claims which follow.

What is claimed is:

1. A system for making fault determinations in high frequency circuits, comprising:
   a positioning system for fixedly mounting a circuit board or device having circuit elements thereon to be tested and for mounting a sensor assembly, said positioning system capable of moving the sensor in X, Y and Z dimensions relative to the circuit board;
   a control system for the positioning system for registering the position of the sensor assembly relative to the circuit board to be tested and for moving the sensor assembly to selected known locations for the circuit board to be tested;
   a sensor assembly for obtaining electromagnetic signals emanating from circuit elements on the circuit board at said selected known locations and for converting said electromagnetic signals into a measured signal value representative of the electromagnetic signals in a digitized format,
   wherein the circuit board under test is operating with a normal power input or stimulus signals and the circuit board being tested is in a typical operating mode and said sensor assembly is mounted on the positioning system above the circuit board to be tested such that it does not come into physical contact with said circuit board during the testing of the circuit board; and
   a processing system for comparing measured signal values from the sensor assembly at selected known locations for the circuit board to be tested and reference signal values from the same locations in a similar circuit board known to be good and for providing an information display concerning whether or not the difference between the measured signal values and the reference signal values is within a selected acceptable range, or outside thereof, which is indicative of a fault at said selected location.

2. The system of claim 1, wherein the information display includes a graphical, tabular or pass/fail indication of a fault at said location.

3. The system of claim 1, wherein the sensor assembly includes a transducer responsive to the electromagnetic signals, producing a representative signal corresponding thereto, a circuit for filtering, attenuating and/or amplifying the representative signal, a mixer responsive to the representative signal, a programmable oscillator to provide sum and difference frequencies and an analog to digital converter responsive to a difference frequency signal to produce a corresponding digitized signal for processing by the processing system.

4. The system of claim 1, wherein the sensor assembly is registered to the circuit board by assigning an XY sensor assembly location to a known position of the circuit board under test.

5. The system of claim 3, wherein the difference frequency signal produced by the sensor assembly is on the order of 10 MHz or less.

6. The system of claim 2, wherein the information display includes a graphical overlay on a representation of a portion of the circuit board to be tested, with indications at selected locations therein as to whether or not measurements at those locations indicate a fault.

7. The system of claim 1, wherein the high frequency circuits are operating at frequencies greater than 200 MHz.

8. The system of claim 1, including means for applying a stimulus signal of pre-selected characteristics to the high frequency circuit under test, wherein the resulting electromagnetic field is measured at said selected locations relative to the high frequency circuit.

9. The system of claim 1, wherein the control system operates such that the sensor assembly receives electromagnetic signals and provides measured values covering a selected area of the circuit board under test.

10. The system of claim 1, wherein the control system operates such that the sensor assembly receives electromagnetic signals and provides measured values only at selected locations in the selected area of the circuit board under test.

* * * * *

UNITED STATES PATENT AND TRADEMARK OFFICE
CERTIFICATE OF CORRECTION

PATENT NO.       : 7,496,466 B2                                      Page 1 of 1
APPLICATION NO.  : 11/625175
DATED            : February 24, 2009
INVENTOR(S)      : Alexander T. Farkas It is certified that error appears in the above-identified patent and that said Letters Patent is hereby corrected as shown below:

Col. 8, Claim 8, lines 32-33:

the phrase ...the resulting electromagnetic field is... should be --the resulting electromagnetic signals are--

Signed and Sealed this

Seventh Day of April, 2009

JOHN DOLL
*Acting Director of the United States Patent and Trademark Office*